(12) United States Patent
Amoh et al.

(10) Patent No.: US 7,298,049 B2
(45) Date of Patent: Nov. 20, 2007

(54) SUBMOUNT FOR MOUNTING SEMICONDUCTOR DEVICE

(75) Inventors: Teruo Amoh, Itami (JP); Takashi Ishii, Itami (JP); Kenjiro Higaki, Itami (JP); Yasushi Tsuzuki, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 209 days.

(21) Appl. No.: 10/506,510

(22) PCT Filed: Mar. 3, 2003

(86) PCT No.: PCT/JP03/02451

§ 371 (c)(1),
(2), (4) Date: Sep. 3, 2004

(87) PCT Pub. No.: WO03/075341

PCT Pub. Date: Sep. 12, 2003

(65) Prior Publication Data

US 2005/0067636 A1    Mar. 31, 2005

(30) Foreign Application Priority Data

Mar. 6, 2002    (JP) .............................. 2002-060764

(51) Int. Cl.
*H01L 23/48* (2006.01)
(52) U.S. Cl. .............................. 257/772; 257/E23.023; 257/E23.026; 257/E21.509
(58) Field of Classification Search ................. 257/99, 257/751, 763, 772, E23.023, E23.026, E21.509
See application file for complete search history.

(56) References Cited

U.S. PATENT DOCUMENTS 5,770,821 A    6/1998    Hikasa et al.
5,914,536 A *  6/1999    Shizuki et al. .............. 257/778

(Continued)

FOREIGN PATENT DOCUMENTS

EP    0 755 074 A2    1/1997

(Continued)

OTHER PUBLICATIONS

Supplemental European Search Report issued in corresponding European Patent Application No. EP 03 74 3567, dated Aug. 28, 2006.

(Continued)

*Primary Examiner*—Ngân V. Ngô
(74) *Attorney, Agent, or Firm*—McDermott Will & Emery LLP

(57) ABSTRACT

A submount that enables the reliable mounting of a semiconductor light-emitting device on it, and a semiconductor unit incorporating the submount. A submount 3 comprises (a) a substrate 4; and (b) a solder layer 8 formed on the top surface 4f of the substrate 4. The solder layer 8 before melting has a surface roughness, Ra, of at most 0.18 μm. It is more desirable that the solder layer 8 before melting have a surface roughness, Ra, of at most 0.15 μm, yet more desirably at most 0.10 μm. A semiconductor unit 1 comprises the submount 3 and a laser diode 2 mounted on the solder layer 8 of the submount 3.

9 Claims, 4 Drawing Sheets

U.S. PATENT DOCUMENTS

| | | | |
|---|---|---|---|
| 5,954,929 A * | 9/1999 | Uchiyama et al. | 204/298.11 |
| 6,298,075 B1 * | 10/2001 | Kitaoka et al. | 372/33 |
| 6,742,701 B2 * | 6/2004 | Furuno et al. | 228/205 |
| 6,767,749 B2 * | 7/2004 | Kub et al. | 438/3 |
| 6,853,074 B2 * | 2/2005 | Kitae et al. | 257/730 |
| 7,151,306 B2 * | 12/2006 | Kitae et al. | 257/614 |
| 2001/0005053 A1 * | 6/2001 | Kitae et al. | 257/736 |
| 2001/0053167 A1 * | 12/2001 | Kitaoka et al. | 372/43 |
| 2002/0190260 A1 * | 12/2002 | Shen et al. | 257/81 |
| 2003/0015721 A1 * | 1/2003 | Slater et al. | 257/99 |
| 2003/0019917 A1 * | 1/2003 | Furuno et al. | 228/246 |
| 2003/0219046 A1 * | 11/2003 | Kitaoka et al. | 372/32 |
| 2004/0238602 A1 * | 12/2004 | Furuno et al. | 228/180.22 |
| 2004/0258943 A1 * | 12/2004 | Takahashi et al. | 428/593 |
| 2005/0098338 A1 * | 5/2005 | Kitae et al. | 174/52.1 |

FOREIGN PATENT DOCUMENTS

| | | |
|---|---|---|
| JP | 1-301866 | 12/1989 |
| JP | 5-48213 A | 2/1993 |
| JP | 5-190973 A | 7/1993 |
| JP | 6-285622 A | 10/1994 |
| JP | 10-65291 A | 3/1998 |
| JP | 2000-121836 A | 4/2000 |
| JP | 2001-308438 A | 10/2001 |
| JP | 2001-332651 | 11/2001 |
| JP | 2002-359427 A | 12/2002 |

OTHER PUBLICATIONS

Japanese Office Action in Corresponding Japanese Patent Application No. 2002-060764, dated Jul. 4, 2006.

* cited by examiner

SUBMOUNT FOR MOUNTING SEMICONDUCTOR DEVICE

TECHNICAL FIELD

The present invention relates to a submount and a semiconductor unit incorporating the submount, and more particularly to a submount for mounting a semiconductor light-emitting device on it and a semiconductor unit incorporating the submount. In the present invention, the term "semiconductor light-emitting device" is used to mean a device such as a laser diode or a light-emitting diode.

BACKGROUND ART

A semiconductor unit that is provided with a semiconductor light-emitting device is commonly known. Such a semiconductor unit is produced by mounting a semiconductor light-emitting device on a submount 103 as shown in FIG. 5. FIGS. 5 and 6 are schematic cross-sectional views explaining a method of producing a conventional semiconductor unit. A method of producing a conventional semiconductor unit is explained below by referring to FIG. 5.

As shown in FIG. 5, in a method of producing a conventional semiconductor unit, first, a submount 103 for mounting a semiconductor light-emitting device on it is prepared. The submount 103 comprises:

(a) a ceramic substrate 104;
(b) a bi-layer 105 formed on the substrate 104, the layer being composed of a layer comprising titanium (Ti) and a layer comprising platinum (Pt) (Ti/Pt bi-layer 105);
(c) a gold (Au) layer 106 as an electrode layer formed on the Ti/Pt bi-layer 105;
(d) a solder-protecting barrier layer 107 comprising platinum (Pt) formed on the Au layer 106; and
(e) a solder layer 108 comprising gold (Au)-tin (Sn)-based solder formed on the solder-protecting barrier layer 107.

In the submount 103, the Ti/Pt bi-layer 105, the Au layer 106, the solder-protecting barrier layer 107, and the solder layer 108 may be formed by using a conventional layer-forming process, such as a vapor deposition method, a sputtering method, or a plating method, or a patterning process, such as a photolithographic method or a metal mask method.

After the submount 103 is prepared as shown in FIG. 5, the solder layer 108 of the submount 103 is heated and melted. A detector 200 detects by image processing whether or not the solder layer 108 is melted. More specifically, before the melting, the solder layer 108 reflects a large amount of light. Accordingly, the detector recognizes the color of the solder layer 108 as "white" by using the binarization in image processing. After the melting, the solder layer 108 reflects a small amount of light. Then, the detector recognizes the color of the solder layer 108 as "black."

As shown in FIG. 6, when the detector 200 recognizes the color of the solder layer 108 as "black," a laser diode 102 as a semiconductor light-emitting device is mounted on a predetermined position on the solder layer 108 (a die-bonding step is performed). Subsequently, the solder layer 108 is cooled and solidified. This process securely bonds the laser diode 102 to the submount 103 with the solder layer 108. Then, the back side of the submount 103 is securely bonded to a heat sink (not shown in the drawing) with solder or the like to complete the production of a semiconductor unit provided with a semiconductor light-emitting device.

The conventional semiconductor unit produced by the process shown in FIGS. 5 and 6 has the following drawback. When the detector 200 recognizes the color of the solder layer 108, if the solder layer 108 has a rough surface, the surface of the solder layer 108 reflects the light diffusely. Consequently, the detector 200 cannot obtain sufficient incident light, so that it recognizes the color of the solder layer 108 as "black." As a result, either the die-bonding equipment suffers an error and stops functioning or the laser diode 102 is pressed against the solder layer 108 before it is melted without successfully bonding the laser diode 102 to the submount 103.

DISCLOSURE OF THE INVENTION

The present invention aims to solve the above-described problem. An object of the present invention is to offer a submount provided with a solder layer to be melted that enables the correct mounting of a semiconductor light-emitting device with high yields, and a semiconductor unit incorporating the submount.

According to the present invention, the present invention offers a submount comprising:

(a) a submount substrate; and
(b) a solder layer that:
   (b1) is formed on the top surface of the submount substrate; and
   (b2) has a surface roughness, Ra, of at most 0.18 μm before the solder layer is melted.

In the submount having the above-described structure, because the solder layer has a surface roughness, Ra, as small as at most 0.18 μm before it is melted, the amount of the diffuse reflection of light at the surface of the solder layer is small. Consequently, when a detector judges the color of the surface of the solder layer by image processing, it can respond with higher fidelity to the change in the state of the layer surface. As a result, the semiconductor light-emitting device can be soldered correctly with increased probability. It is more desirable that the solder layer have a surface roughness, Ra, of at most 0.15 μm before it is melted, yet more desirably at most 0.10 μm before it is melted. The surface roughness Ra of the solder layer is measured with a method stipulated in the Japanese Industrial Standards (JIS B 0601).

It is desirable that the solder in the solder layer before it is melted have an average crystal-grain diameter of at most 3.5 μm, more desirably at most 2 μm. This reduced average crystal-grain diameter enables the further prevention of the diffuse reflection of light at the surface of the solder layer.

It is desirable that the top surface of the submount substrate have a surface roughness, Ra, of at most 0.10 μm, more desirably at most 0.05 μm. The decrease in the surface roughness Ra of the substrate can suppress the increase in the surface roughness Ra of the solder layer resulting from the transferring of the surface unevenness of the substrate to the solder layer. As a result, the amount of the diffuse reflection of light at the surface of the solder layer can be further decreased.

The submount may further comprise a solder-protecting barrier layer formed between the submount substrate and the solder layer.

The submount may further comprise an electrode layer formed between the submount substrate and the solder-protecting barrier layer. In this case, the electrode layer can be used as an underlying layer of the solder layer.

The submount may further comprise between the submount substrate and the solder-protecting barrier layer:
(a) an intimate-contact layer formed such that it makes contact with the top surface of the submount substrate; and
(b) an element diffusion-preventing layer formed on the intimate-contact layer.

In this case, the electrode layer is placed on the element diffusion-preventing layer.

The submount may have a structure in which:
(a) the intimate-contact layer comprises titanium;
(b) the element diffusion-preventing layer comprises platinum;
(c) the electrode layer comprises gold;
(d) the solder-protecting barrier layer comprises platinum; and
(e) the solder layer comprises a gold-tin-based solder.

It is desirable that the submount substrate comprise an aluminum nitride-sintered body. In this case, because aluminum nitride has high thermal conductivity, a submount having superior heat-dissipating property can be produced.

According to one aspect of the present invention, the present invention offers a semiconductor unit comprising:
(a) any one of the submounts as described above; and
(b) a semiconductor light-emitting device mounted on the solder layer of the submount.

The semiconductor unit enables the mounting of a semiconductor light-emitting device on the submount in good timing while the solder layer is under a desirable condition.

BEST MODE FOR CARRYING OUT THE INVENTION

Figure 1:
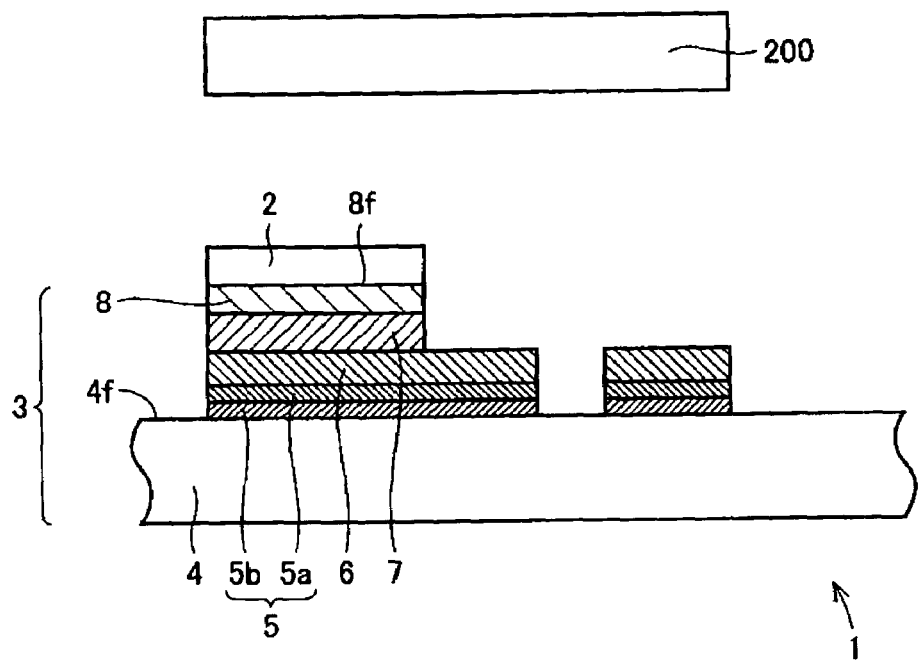
FIG. 1 is a schematic cross-sectional view showing an embodiment of the semiconductor unit of the present invention.

Embodiments of the present invention are explained below by referring to the drawing. In the following drawing, the same or a similar item bears the same reference numeral to avoid duplicated explanations.

FIG. 1 is a schematic cross-sectional view showing an embodiment of the semiconductor unit of the present invention. As shown in FIG. 1, a semiconductor unit 1 has a structure in which a laser diode 2 as a semiconductor light-emitting device is mounted on a submount 3. The submount 3 comprises, for example:
(a) a submount substrate 4 made of a sintered body comprising aluminum nitride (AlN);
(b) a bi-layer 5 composed of a titanium (Ti) layer 5b as an intimate-contact layer and a platinum (Pt) layer 5a as an element diffusion-preventing layer (Ti/Pt bi-layer 5);
(c) a gold (Au) layer 6 as an electrode layer formed on the Ti/Pt bi-layer 5;
(d) a solder-protecting barrier layer 7 comprising platinum (Pt) formed on the Au layer 6; and
(e) a solder layer 8 comprising gold (Au)-tin (Sn)-based solder formed on the solder-protecting barrier layer 7.

As shown in FIG. 1, the laser diode 2 is bonded to the submount 3 through the solder layer 8. The widths of the laser diode 2, the solder layer 8, and the solder-protecting barrier layer 7 are nearly the same. The solder layer 8 may have a width and a length either larger or smaller than those of the laser diode 2. Similarly, the solder-protecting barrier layer 7 may have a width and a length either larger or smaller than those of the solder layer 8.

Figure 2:
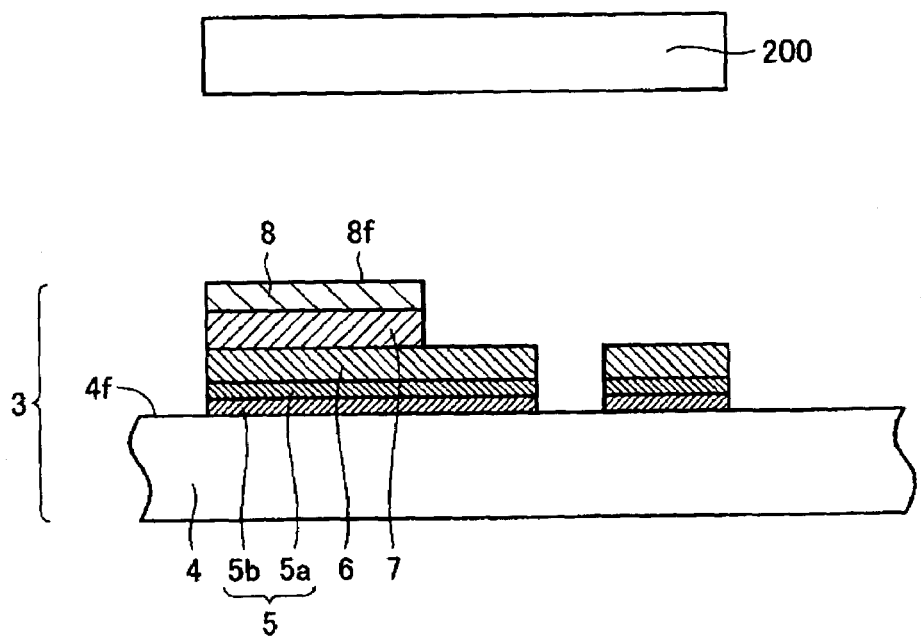
FIG. 2 is a schematic cross-sectional view explaining the method of producing the semiconductor unit shown in FIG. 1.

In the semiconductor unit shown in FIGS. 1 and 2, the substrate 4 of the submount 3 may be made of ceramic, semiconductor, or metal. The types of the ceramic constituting the substrate 4 include ceramics consisting mainly of the above-described aluminum nitride (AlN), aluminum oxide ($Al_2O_3$), silicon carbide (SiC), or silicon nitride ($Si_3N_4$). The types of the semiconductor constituting the substrate 4 include silicon (Si). The types of the metal constituting the substrate 4 include copper (Cu), tungsten (W), molybdenum (Mo), iron (Fe), alloys comprising these, and composite materials composed of these materials.

It is desirable that the substrate 4 be made of a material having high thermal conductivity. It is desirable that the substrate 4 have a thermal conductivity of at least 100 W/mK, more desirably at least 170 W/mK. In addition, it is desirable that the substrate 4 have a coefficient of thermal expansion comparable to that of the material constituting the laser diode 2. For example, when the laser diode 2 is made of a material such as gallium arsenide (GaAs) or indium phosphide (InP), it is desirable that the substrate 4 have a coefficient of thermal expansion of at most $10\times10^{-6}$/K, more desirably at most $5\times10^{-6}$/K.

When the substrate 4 is made of ceramic, the substrate may be provided with either a through hole that electrically connects a part of the top surface of the substrate 4 to the opposite portion in the back face or a via hole in which a conducting material (via fill) is filled. It is desirable that the conducting material (via fill) for filling the via hole consist mainly of a metal having a high melting point, particularly tungsten (W) or molybdenum (Mo). The above-described conducting material may also comprise, in addition to the metallic material such as tungsten or molybdenum, a transition metal such as titanium (Ti), a constituent material of glass, or a base material for forming the substrate 4 such as aluminum nitride (AlN).

It is desirable that the substrate 4 have a "flatness" of at most 5 μm, more desirably at most 1 μm. If the flatness is more than 5 μm, when the laser diode 2 is bonded, gaps may be developed between the submount 3 and the laser diode 2. The gaps reduce the effect of cooling the laser diode 2. The term "flatness" is defined as the magnitude of the deviation from the geometrically precise plane of a plane form and is stipulated in JIS B 0621.

The Ti layer, a layer comprising titanium (Ti), constituting a part of the Ti/Pt bi-layer 5 is formed to make contact with the top surface of the substrate 4. Consequently, the Ti layer is made of a material capable of making intimate contact with the substrate 4, so that it is called an intimate-contact layer. The intimate-contact layer may be made of a material such as the above-described titanium (Ti), chromium (Cr), nickel-chromium (NiCr) alloy, tantalum (Ta), or a compound of these.

The platinum (Pt) layer constituting the remaining part of the Ti/Pt bi-layer 5 is formed on the top surface of the Ti layer and is called an element diffusion-preventing layer. The element diffusion-preventing layer may be made of a material such as the above-described platinum (Pt), palladium (Pd), nickel-chromium (NiCr) alloy, a tungsten-titanium (TiW) compound, nickel (Ni), or molybdenum (Mo). The Au layer 6 is a so-called electrode layer and usually consists mainly of Au.

The solder-protecting barrier layer 7 may be made of a material such as platinum (Pt), nickel-chromium (NiCr) alloy, or nickel (Ni). The solder layer 8 may be made of a material such as gold-tin (AuSn)-based solder, gold-germanium (AuGe)-based solder, lead-tin (PbSn)-based solder, indium-tin (InSn)-based solder, silver-tin (AgSn)-based solder, other alloy solder, solder produced by alloying these materials, or a laminated body composed of metals used in these alloy solders. When the solder layer 8 is made of gold-tin (AuSn)-based solder, it is desirable that the solder either contain at least 65 wt % and at most 85 wt % gold (Au) or contain at least 5 wt % and at most 20 wt % gold (Au).

Hereinafter the above-described Ti/Pt bi-layer 5, Au layer 6, solder-protecting barrier layer 7, and solder layer 8 are referred to as a metallized layer. These metallized layers may be formed by using conventional layer-forming methods as required. More specifically, the types of the metallized layer-forming methods include a layer-forming process, such as an vapor deposition method and a sputtering method, and a plating process. The above-described Ti/Pt bi-layer 5, Au layer 6, solder-protecting barrier layer 7, and solder layer 8 can be formed so as to have a specified pattern by using a patterning process. The types of the patterning process include a lift-off method incorporating photolithography, a chemical etching method, a dry etching method, and a metal mask method.

It is desirable that the titanium (Ti) layer 5b constituting the intimate-contact layer of the Ti/Pt bi-layer 5 have a thickness of at least 0.01 μm and at most 1.0 μm. It is desirable that the platinum (Pt) layer 5a constituting the element diffusion-preventing layer of the Ti/Pt bi-layer 5 have a thickness of at least 0.01 μm and at most 1.5 μm. It is desirable that the Au layer 6 as the electrode layer have a thickness of at least 0.1 μm and at most 10 μm. It is desirable that solder-protecting barrier layer 7 have a thickness of at least 0.01 μm and at most 1.5 μm. It is desirable that the solder layer 8 have a thickness of at least 0.1 μm and at most 10 μm.

In the present invention, the term "semiconductor light-emitting device" is used to mean a device such as a laser diode or a light-emitting diode. The semiconductor material constituting the device may be a material such as a GaAs semiconductor, an InP semiconductor, or another III-V group compound semiconductor. The device may be either a face-up type or a face-down type. The face-up-type device has a structure in which the light-emitting portion is formed at a place closer to the top surface and the light emerges either from the top surface or from a side face. In contrast, the face-down-type device has a structure in which the light-emitting portion is formed at a place closer to the back face, which makes contact with the solder layer 8, and the light emerges from a side face. When the face-down-type device is used as the laser diode 2 shown in FIG. 1, the light-emitting portion, which generates heat, is positioned at a place closer to the substrate 4 in comparison with the face-up-type device. Therefore, this arrangement can further improve the heat-dissipating property of the semiconductor unit 1.

The laser diode 2 is provided on its surface with an insulating layer, such as a silicon oxide ($SiO_2$) layer, and a metallized layer as an electrode layer, such as a gold (Au) layer. It is desirable that the gold (Au) layer as the electrode layer have a thickness of at least 0.1 μm and at most 10 μm in order to secure a good wettability with the solder layer 8.

The semiconductor unit 1 shown in FIG. 1 may be bonded to a heat sink by using solder or the like. More specifically, first, layers such as an intimate-contact layer and an element diffusion-preventing layer are formed on the back face of the substrate 4 and at the place opposite to the place where the Ti/Pt bi-layer 5 is formed on the top surface. Then, a heat sink is placed at the back-face side of the substrate 4 through sheet-shaped solder. The substrate 4 is securely bonded to the heat sink through the solder placed at the back-face side of the substrate 4. The solder for bonding the substrate 4 to the heat sink may be the above-described sheet-shaped solder (solder foil). Alternatively, a layer of solder may be placed on the top surface of the heat sink in advance. Yet alternatively, a solder layer may be formed on the metallized layer on the back face of the substrate 4. In this case, it is desirable that the laser diode 2 and the heat sink be bonded concurrently to the substrate 4.

The heat sink may be made of a material such as metal or ceramic. The types of the metal constituting the heat sink include copper (Cu), tungsten (W), molybdenum (Mo), iron (Fe), alloys comprising these metals, and composite materials composed of these materials. It is desirable to form on the surface of the heat sink a nickel (Ni) layer, a gold (Au) layer, or a layer comprising the foregoing metal. These layers can be formed by the vapor deposition method and the plating method. It is desirable that the heat sink have a thermal conductivity as high as at least 100 W/mK.

Next, the method of producing the semiconductor unit shown in FIG. 1 is explained on the assumption that the substrate would be made of an aluminum nitride-sintered body. FIG. 2 is a schematic cross-sectional view explaining the method of producing the semiconductor unit shown in FIG. 1.

The first step is the production of the substrate. The substrate may have a width of 50 mm, a length of 50 mm, and a thickness of 0.4 mm, for example. The substrate has a size larger than that of the substrate 4 of the submount 3. A required structure is formed on the surface of the substrate. The substrate is cut and separated in the below-mentioned cutting step to obtain the submount 3. The substrate to be used as the substrate 4 of the submount 3 is produced according to an ordinary substrate production method. In this case, the substrate 4 is made of an aluminum nitride (AlN)-sintered body. The substrate 4 made of ceramic, such as an aluminum nitride-sintered body, may be produced by applying a method for producing an ordinary ceramic structure.

The second step is the lapping or polishing of the surface of the substrate made of an aluminum nitride-sintered body and produced in the first step, the substrate production step. It is desirable that the aluminum nitride substrate to be used as the substrate 4 be lapped or polished so as to attain a surface roughness, Ra, of at most 0.10 μm, more desirably at most 0.05 μm. The lapping or polishing operation may be performed by applying an ordinary method, such as the lapping with sandpaper or the polishing with abrasives. Alternatively, a grinding machine or the sandblasting may be employed.

The third step is to provide a pattern for forming with a specified pattern the Ti layer 5b as an intimate-contact layer, the Pt layer 5a as an element diffusion-preventing layer, and the Au layer 6 as an electrode layer all as shown in FIG. 2. In this patterning step, the other region than the region for forming the Ti layer 5b, the Pt layer 5a, and the Au layer 6 on the surface of the substrate is provided with a resist layer by using the photolithographic method.

The fourth step is to vapor-deposit an intimate-contact layer. More specifically, a Ti layer to be used as the Ti layer 5b as an intimate-contact layer is vapor-deposited on the surface of the substrate. The formed Ti layer may have a thickness of 0.1 μm, for example. The fifth step is to form a Pt layer to be used as the Pt layer 5a as an element diffusion-preventing layer on the Ti layer to be used as the Ti layer 5b as an intimate-contact layer. The Pt layer may have a thickness of 0.2 μm, for example.

The sixth step is to form the Au layer 6 as an electrode layer by the vapor deposition method. The Au layer may have a thickness of 0.6 μm, for example.

The seventh step is a lift-off step. In this step, the resist layer formed in the third step, a patterning step, is removed with a resist-removing liquid together with the part of the Ti layer, the Pt layer, and the Au layer positioned on the resist layer. The removal can form the Ti layer 5b, the Pt layer 5a, and the Au layer 6 all having the specified pattern on the surface of the substrate.

The eighth step is to form the solder-protecting barrier layer 7. In this step, the solder-protecting barrier layer 7 made of platinum (Pt) is formed on the Au layer 6 by using the metal mask method. The solder-protecting barrier layer 7 has a thickness of 0.2 μm.

The ninth step is to form the solder layer 8 on the solder-protecting barrier layer 7 by the vapor deposition method.

In the step for forming the solder layer 8, the decrease in the pressure (ultimate vacuum degree) of the atmosphere in the chamber before the layer formation decreases the crystal-grain diameter of the solder. It is desirable that the ultimate vacuum degree be at most $5.0 \times 10^{-4}$ Pa. If it exceeds $5.0 \times 10^{-4}$ Pa, impurity gases such as water vapor and oxygen tend to remain in the solder layer. As a result, foreign matters having a large particle diameter may be included in the solder layer 8. It is more desirable that the ultimate vacuum degree be at most $1.0 \times 10^{-4}$ Pa.

When the layer-forming rate of the solder is varied, the crystal-grain diameter and the surface roughness Ra can be varied. It is desirable that the layer-forming rate be at least 0.1 nm/s and at most 1.0 nm/s, more desirably at least 0.3 nm/s and at most 0.7 nm/s. If it is less than 0.1 nm/s, the growth of the nucleus is promoted, increasing the crystal-grain diameter. Consequently, the surface roughness Ra is also increased. If it is more than 1.0 nm/s, the temperature of the substrate rises, causing the crystal-grain diameter to tend to increase due to the below-described reason. As a result, the surface roughness Ra tends to increase.

When the surface temperature of the substrate 4 is varied, the crystal-grain diameter and the surface roughness Ra can be varied. It is desirable that the temperature be at least 20° C. and at most 150° C., more desirably at least 20° C. and at most 120° C. If it is more than 150° C., the temperature of the substrate rises, promoting the growth of the nucleus. As a result, the crystal-grain diameter increases, increasing the surface roughness Ra.

The solder layer 8 having a specified pattern may be formed by the metal mask method. Alternatively, it may be formed by the photolithographic method as shown in the third to seventh steps of the method of producing the semiconductor unit of the present invention.

The tenth step is to cut the substrate prepared in the first step on the surface of which the specified structure is formed as described above. After the cutting, the submount 3 shown in FIG. 2 is obtained.

The eleventh step is to bond the laser diode 2 as a semiconductor light-emitting device to the submount 3. First, the solder layer 8 is melted by heating. A detector 200 detects by image processing whether or not the solder layer 8 is melted. More specifically, the illumination intensity of the light incident upon the detector is divided into 256 levels of gray, for example. The level of the darkest portion in the substrate 4 is defined as "0," and the brightest portion in the Au layer 6 as "255." When the level of gray of the light incident from the solder layer 8 exceeds "50," its color is recognized as "white" and the solder layer 8 is judged to be unmolten. In contrast, when the level of gray of the light incident from the solder layer 8 is "50 or below," its color is recognized as "black" and the solder layer 8 is judged to be molten. Thus, the binarization in image processing judges whether or not the solder layer 8 is molten.

The laser diode 2 is placed on the solder layer 8 judged to be molten. Thus, the laser diode 2, a chip made of GaAs, is bonded to the submount 3 through the solder layer 8. This completes the production of the semiconductor unit 1 shown in FIG. 1.

In the submount of the present invention produced through the above-described process, the surface 8f of the solder layer 8 has a surface roughness, Ra, as small as 0.18 μm before it is melted as described below. Consequently, the diffuse reflection of light at the surface of the solder layer 8 can be suppressed, so that a sufficient amount of the reflected light can enter the detector 200. In the die-bonding step, this sufficient amount of light can significantly reduce the probability that the detector 200 would misjudge the solder layer 8 before melting to be "black," i.e., "molten." In other words, whether or not the solder layer 8 is molten can be judged correctly with higher probability. As a result, the laser diode 2 can be soldered to the submount 3 in good timing while the solder layer is molten.

EXAMPLE (Production of Samples and Their Evaluation)

As shown in Tables I and II, Samples 1 to 30 were produced by the below-described procedure. Samples 1 to 20 were produced as Examples, and Samples 21 to 30 were produced as Comparative examples.

TABLE I

| Sample No. | Category of Sample | Composition of solder | Ultimate vacuum degree ($\times 10^{-4}$ Pa) | Layer-forming rate (nm/s) | Temperature of substrate 4 (° C.) |
|---|---|---|---|---|---|
| 1 | Example | Au:Sn = 80:20 | 0.8 | 0.5 | 80 |
| 2 | | Au:Sn = 80:20 | 1.5 | 0.5 | 80 |
| 3 | | Au:Sn = 80:20 | 4.0 | 0.5 | 80 |
| 4 | | Au:Sn = 80:20 | 0.8 | 0.2 | 80 |
| 5 | | Au:Sn = 80:20 | 0.8 | 0.8 | 80 |
| 6 | | Au:Sn = 80:20 | 0.8 | 0.5 | 50 |
| 7 | | Au:Sn = 80:20 | 0.8 | 0.5 | 130 |
| 8 | | Au:Sn = 80:20 | 0.8 | 0.5 | 80 |

TABLE I-continued

| Sample No. | Category of Sample | Composition of solder | Ultimate vacuum degree (×10⁻⁴ Pa) | Layer-forming rate (nm/s) | Temperature of substrate 4 (° C.) |
|---|---|---|---|---|---|
| 9  |             | Au:Sn = 80:20 | 0.8 | 0.5  | 80  |
| 10 |             | Au:Sn = 80:20 | 0.8 | 0.5  | 80  |
| 11 |             | Au:Sn = 80:20 | 1.1 | 0.6  | 100 |
| 12 |             | Au:Sn = 80:20 | 3.0 | 0.8  | 130 |
| 13 |             | Au:Sn = 80:20 | 3.0 | 0.8  | 80  |
| 14 |             | Au:Sn = 80:20 | 3.0 | 0.5  | 130 |
| 15 |             | Au:Sn = 80:20 | 0.8 | 0.8  | 130 |
| 16 |             | Au:Sn = 10:90 | 0.8 | 0.5  | 80  |
| 17 |             | Au:Sn = 10:90 | 3.0 | 0.8  | 130 |
| 18 |             | Au:Sn = 10:90 | 3.0 | 0.5  | 80  |
| 19 |             | Au:Sn = 10:90 | 0.8 | 0.2  | 80  |
| 20 |             | Au:Sn = 10:90 | 0.8 | 0.5  | 130 |
| 21 | Com-        | Au:Sn = 80:20 | 8.0 | 0.05 | 170 |
| 22 | parative    | Au:Sn = 80:20 | 6.0 | 0.5  | 80  |
| 23 | example     | Au:Sn = 80:20 | 0.8 | 0.05 | 80  |
| 24 |             | Au:Sn = 80:20 | 0.8 | 1.2  | 80  |
| 25 |             | Au:Sn = 80:20 | 0.8 | 0.5  | 170 |
| 26 |             | Au:Sn = 80:20 | 0.8 | 0.5  | 80  |
| 27 |             | Au:Sn = 80:20 | 6.0 | 0.5  | 80  |
| 28 |             | Au:Sn = 10:90 | 6.0 | 0.5  | 80  |
| 29 |             | Au:Sn = 10:90 | 0.8 | 1.2  | 80  |
| 30 |             | Au:Sn = 10:90 | 0.8 | 0.5  | 170 |

TABLE II

| Sample No. | Category of Sample | Presence or absence of solder-protecting barrier layer 7 | Surface roughness Ra of top surface 4f (μm) | Surface roughness Ra of surface 8f (μm) | Average crystal-grain diameter of solder layer 8 (μm) | Successful image processing |
|---|---|---|---|---|---|---|
| 1  | Exam-     | ○ | 0.04 | 0.08 | 1.3 | 20/20 |
| 2  | ple       | ○ | 0.04 | 0.12 | 2.3 | 19/20 |
| 3  |           | ○ | 0.04 | 0.15 | 3.0 | 18/20 |
| 4  |           | ○ | 0.04 | 0.14 | 2.8 | 18/20 |
| 5  |           | ○ | 0.04 | 0.13 | 2.7 | 19/20 |
| 6  |           | ○ | 0.04 | 0.08 | 1.2 | 20/20 |
| 7  |           | ○ | 0.04 | 0.15 | 3.0 | 17/20 |
| 8  |           | ○ | 0.06 | 0.11 | 1.4 | 19/20 |
| 9  |           | ○ | 0.08 | 0.12 | 1.3 | 19/20 |
| 10 |           | X | 0.04 | 0.08 | 1.3 | 20/20 |
| 11 |           | X | 0.04 | 0.13 | 2.6 | 18/20 |
| 12 |           | X | 0.08 | 0.18 | 3.4 | 16/20 |
| 13 |           | ○ | 0.04 | 0.16 | 3.2 | 17/20 |
| 14 |           | ○ | 0.04 | 0.17 | 3.3 | 16/20 |
| 15 |           | ○ | 0.04 | 0.16 | 3.2 | 16/20 |
| 16 |           | ○ | 0.04 | 0.09 | 1.4 | 20/20 |
| 17 |           | ○ | 0.08 | 0.17 | 3.3 | 17/20 |
| 18 |           | ○ | 0.04 | 0.14 | 2.7 | 19/20 |
| 19 |           | ○ | 0.04 | 0.14 | 2.8 | 19/20 |
| 20 |           | ○ | 0.04 | 0.15 | 3.1 | 18/20 |
| 21 | Com-      | ○ | 0.12 | 0.32 | 6.2 | 0/20  |
| 22 | parative  | ○ | 0.04 | 0.20 | 3.8 | 10/20 |
| 23 | example   | ○ | 0.04 | 0.25 | 4.9 | 4/20  |
| 24 |           | ○ | 0.04 | 0.22 | 4.2 | 7/20  |
| 25 |           | ○ | 0.04 | 0.23 | 4.5 | 5/20  |
| 26 |           | ○ | 0.12 | 0.20 | 1.4 | 11/20 |
| 27 |           | X | 0.04 | 0.21 | 4.2 | 8/20  |
| 28 |           | ○ | 0.04 | 0.21 | 4.1 | 8/20  |
| 29 |           | ○ | 0.04 | 0.23 | 4.4 | 6/20  |
| 30 |           | ○ | 0.04 | 0.23 | 4.5 | 5/20  |

Note:
In the "Presence or absence of solder-protecting barrier layer 7," the sign "○" shows the presence of the solder-protecting barrier layer 7, and the sign "X" shows the absence of the solder-protecting barrier layer 7.

First, aluminum nitride-sintered bodies having a width of 50 mm, a length of 50 mm, and a thickness of 0.4 mm were prepared as a substrate. The surface of individual sintered bodies was polished to cause the top surface 4f to have the surface roughness Ra as shown in Table II. Operations using the lift-off method incorporating photolithography and the vapor deposition method formed a metallized layer comprising the Ti layer 5b having a thickness of 0.1 μm, the Pt layer 5a of 0.2 μm, and the Au layer 6 of 0.6 μm. Samples other than Samples 10, 11, 12, and 27 were provided with a solder-protecting barrier layer 7, made of platinum, having a thickness of 0.2 μm on the metallized layer by using the metal mask and vapor deposition methods.

All Samples were provided with a solder layer 8 having a thickness of 3 μm by using the metal mask and vapor deposition methods. The composition of the solder layer 8 and the condition of the vapor deposition are shown in Table I. In Table I, "composition of solder" shows the weight ratio of the elements constituting the solder layer 8. Twenty submounts having a width of 1.2 mm, a length of 1.5 mm, and a thickness of 0.3 mm were obtained from each of Samples 1 to 30 by cutting the substrate 4. The proportion of the successful image processing by the detector 200 at the time of the soldering of the laser diode 2 was examined for each Sample. The results are also shown in Table II.

In Table II, "successful image processing" shows the proportion of the number of submounts whose solder layer 8 was actually molten when the detector 200 judged it to be molten. The proportion closer to one means that the detector 200 correctly detected the melting of the solder layer 8 with high probability. As can be seen from Table II, to increase this probability in the submount 3 of the semiconductor unit 1 of the present invention (see FIG. 1), it is desirable that the surface 8f of the solder layer 8 have a surface roughness, Ra, of at most 0.18 μm, more desirably at most 0.15 μm, yet more desirably at most 0.10 μm. Similarly, it is desirable that the solder constituting the solder layer 8 have an average crystal-grain diameter of at most 3.5 μm, more desirably at most 2.0 μm. It is desirable that the top surface 4f of the substrate 4 have a surface roughness, Ra, of at most 0.10 μm, more desirably at most 0.05 μm.

(Concrete Data on the Level of Gray)

Sample 1, one of Examples of the present invention, was subjected to the following test. The detector 200 measured the intensity (illumination intensity) of light reflected from the substrate 4 as the submount substrate, from the solder layer 8 before it is melted, and from the Au layer 6. A part of the result is shown in FIG. 3.

Figure 3:
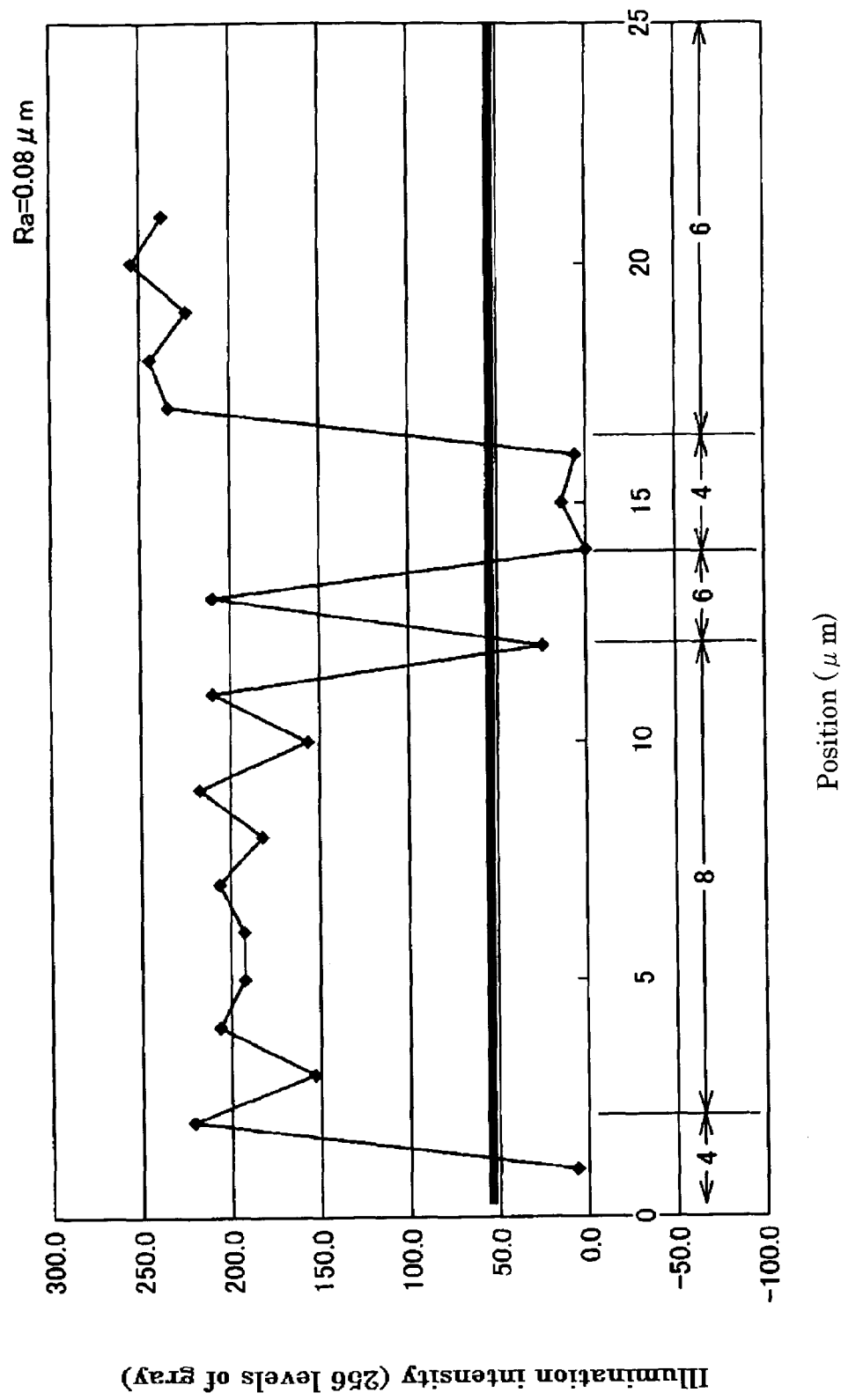
FIG. 3 is a graph showing a gray-level property of a specimen belonging to Sample 1.

In FIG. 3, the axis of ordinates shows the illumination intensity of the reflected light in 256 levels of gray, and the axis of abscissas shows the position of the submount. For example, the numerals "4," "8," and "6" respectively show the substrate 4, the solder layer 8, and the Au layer 6 illustrated in FIGS. 1 and 2, and the axis of ordinates shows the intensity of light reflected from individual positions.

As can be seen from FIG. 3, in the present invention, because the intensity of light reflected from the solder layer 8 is high, the detector 200 can easily recognize the state of solder layer 8 as being unmolten.

Sample 21, one of Comparative examples, was also subjected to the foregoing test. The detector 200 measured the intensity (illumination intensity) of light reflected from the substrate 104, from the solder layer 108 before it is melted, and from the Au layer 106. A part of the result is shown in FIG. 4.

Figure 4:
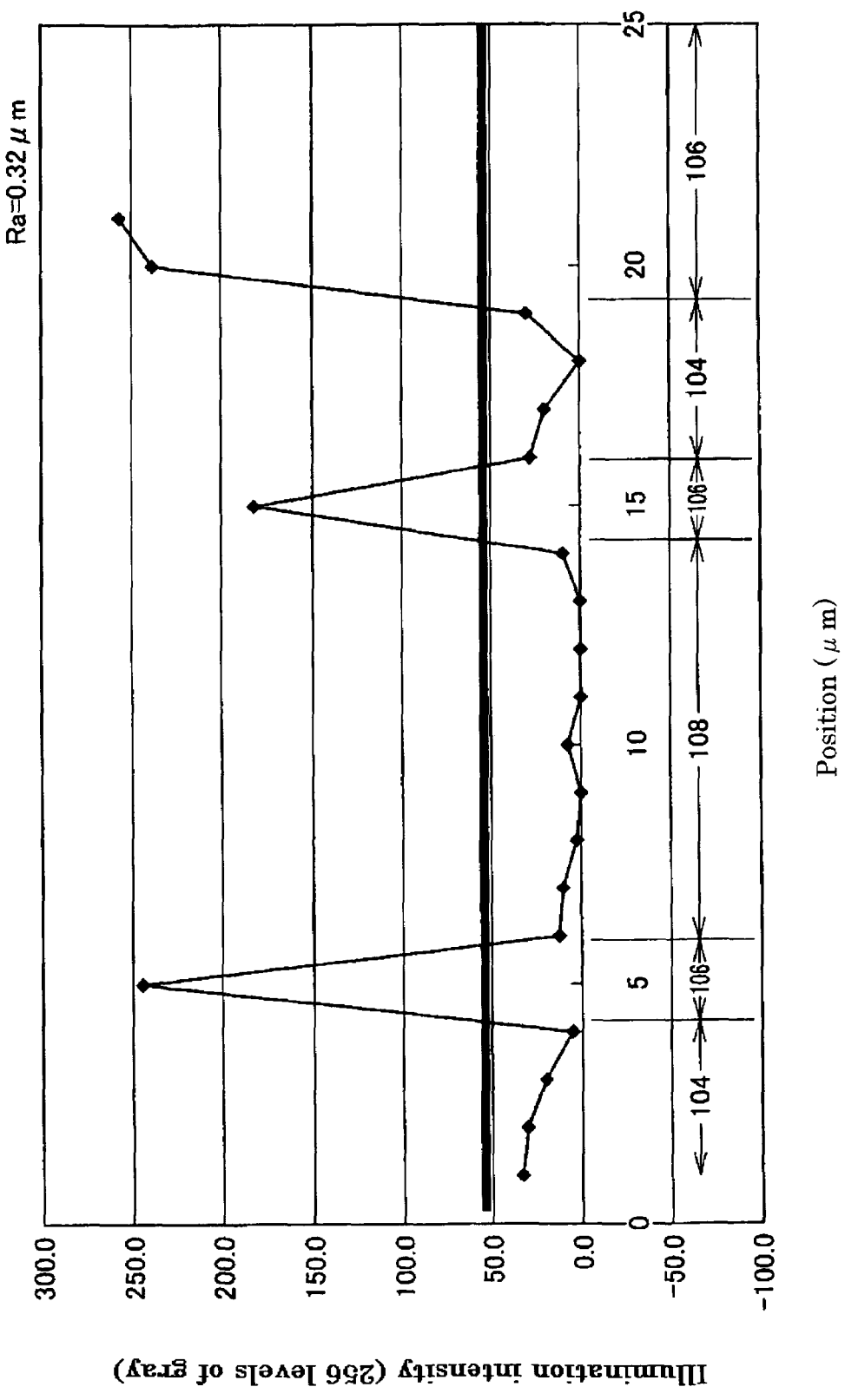
FIG. 4 is a graph showing a gray-level property of a specimen belonging to Sample 21.
Figure 5:
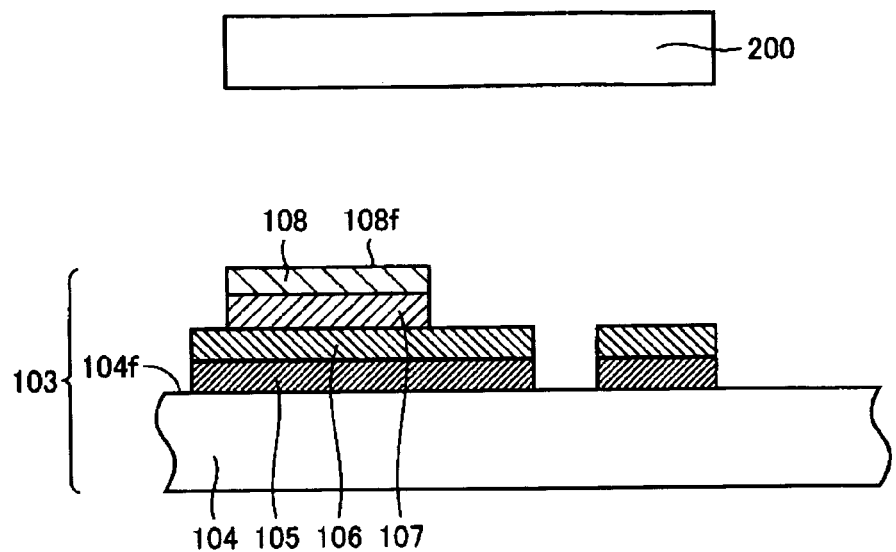
FIG. 5 is a schematic cross-sectional view explaining the first step of a method of producing a conventional semiconductor unit.
Figure 6:
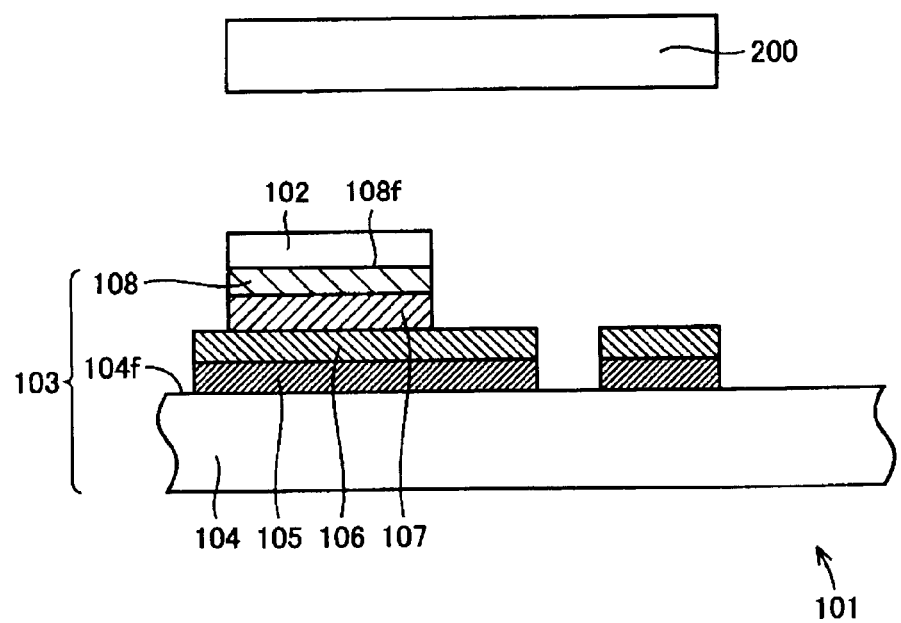
FIG. 6 is a schematic cross-sectional view explaining the second step of the method of producing the conventional semiconductor unit.

In FIG. 4, the axis of ordinates shows the illumination intensity of the reflected light in 256 levels of gray, and the axis of abscissas shows the position of the submount. For example, the numerals "104," "108," and "106" respectively show the substrate 104, the solder layer 108, and the Au layer 106 illustrated in FIGS. 5 and 6, and the axis of ordinates shows the intensity of light reflected from individual positions.

As can be seen from FIG. 4, in Sample 21 as one of Comparative examples, because the intensity of light reflected from the solder layer 108 is low, it is difficult for the detector 200 to correctly recognize the state of the solder layer 108 as being unmolten.

It is to be understood that the above-described embodiments and examples are illustrative and not restrictive in all respects. The scope of the present invention is shown by the scope of the appended claims, not by the above-described embodiments and examples. Accordingly, the present invention is intended to cover all modifications included within the meaning and scope equivalent to the scope of the claims.

INDUSTRIAL APPLICABILITY

As explained above, the present invention can offer a submount that can reliably mount a semiconductor light-emitting device on it by recognizing the melting of the solder layer with a detector, and a semiconductor unit incorporating the submount.

The invention claimed is:

1. A submount, comprising:
   (a) a submount substrate; and
   (b) a solder layer that:
      (b1) is formed on the top surface of the submount substrate; and
      (b2) has a surface roughness, Ra, of at most 0.18 μm and has an average crystal-grain diameter of at most 3.5 μm.

2. A submount as defined by claim 1, wherein the solder layer has a surface roughness, Ra, of at most 0.15 μm.

3. A submount as defined by claim 1, wherein the solder layer has a surface roughness, Ra, of at most 0.10 μm.

4. A submount as defined by claim 1, wherein the top surface of the submount substrate has a surface roughness, Ra, of at most 0.10 μm.

5. A submount as defined by claim 1, the submount further comprising a solder-protecting barrier layer formed between the submount substrate and the solder layer.

6. A submount as defined by claim 5, the submount further comprising an electrode layer formed between the submount substrate and the solder-protecting barrier layer.

7. A submount as defined by claim 6, the submount further comprising between the submount substrate and the solder-protecting barrier layer:
   (a) an intimate-contact layer formed such that it makes contact with the top surface of the submount substrate; and
   (b) an element diffusion-preventing layer formed on the intimate-contact layer; the electrode layer being placed on the element diffusion-preventing layer.

8. A submount as defined by claim 7, wherein:
   (a) the intimate-contact layer comprises titanium;
   (b) the element diffusion-preventing layer comprises platinum;
   (c) the electrode layer comprises gold;
   (d) the solder-protecting barrier layer comprises platinum; and
   (e) the solder layer comprises gold-tin-based solder.

9. A submount as defined by claim 1, wherein the submount substrate comprises an aluminum nitride-sintered body.

* * * * *